United States Patent [19]

Garshelis

[11] 3,932,112
[45] Jan. 13, 1976

[54] MAGNETOELASTIC, REMANENT, HYSTERETIC DEVICES

[76] Inventor: Ivan J. Garshelis, 61 Oleander Way, Clark, N.J. 07066

[22] Filed: July 12, 1974

[21] Appl. No.: 488,208

[52] U.S. Cl. ............... 431/255; 335/215; 431/264
[51] Int. Cl.² .......................................... F23Q 3/00
[58] Field of Search ............... 431/255, 254, 264; 335/215; 340/174 R; 310/26

[56] References Cited
UNITED STATES PATENTS
3,083,353   3/1963   Bobeck ........................... 340/174 R Primary Examiner—Edward G. Favors
Attorney, Agent, or Firm—Hubbell, Cohen & Stiefel

[57] ABSTRACT

Devices relying on the Inverse Wiedemann Effect. In all instances, magnetostrictive rods are circularly magnetized and exhibit hysteresis when plotting axial induction vs. twist. Hysteresis, especially when rectangular, yields high $d\phi/dt$ upon twisting to result in large output voltage across terminals of coil wound about the rod. In other embodiments, rectangular hysteresis gives rise to one-shot electric push button or sequential switch. Hysteretic magnetostrictive circularly magnetized rods also serve as recording devices to detect mechanical movement or shock.

14 Claims, 8 Drawing Figures

MAGNETOELASTIC, REMANENT, HYSTERETIC DEVICES

RELATED APPLICATIONS

This application is related to four applications of even date filed by the inventor hereof, which other applications are entitled ELECTROMAGNETIC ANISOTROPIC DEVICES, Ser. No. 488,209, ELECTROMECHANICAL TRANSDUCERS, Ser. No. 488,219, MECHANICAL MAGNETS, Ser. No. 488,841, and METHOD AND APPARATUS FOR CIRCULARLY MAGNETIZING A CONDUCTIVE HELICAL ROD, Ser. No. 488,220, the contents of all of which are hereby incorporated by reference in their entireties.

BACKGROUND OF THE INVENTION

1. Field of the Invention

This invention relates to devices which rely on the Inverse Wiedemann Effect, which devices may be employed in a number of applications, such as voltage generators and magnetic memory devices.

2. The Prior Art

For many years, the so-called Wiedemann Effect has been well known. The Wiedemann Effect is the resulting twist produced in a wire that exhibits magnetostriction when the wire is placed in a longitudinal magnetic field and has an electric current flowing therethrough. The converse or inverse of this phenomenon has also been long recognized and is commonly called the Inverse Wiedemann Effect. In the Inverse Wiedemann Effect, axial magnetization is produced by a magnetostrictive wire that carries current therethrough when the wire is twisted.

There have been a number of attempts to employ the Wiedemann and Inverse Wiedemann Effects in practical applications. Such attempts are discussed at length in an article by J. A. Granath entitled *Instrumentation Applications of Inverse Wiedemann Efffect* which appeared in the Journal of Applied Physics, Vol. 31, pp. 178S – 180S (May, 1961) and in a publication by The International Nickel Company, Inc. of New York, New York entitled *Magnetostriction*. At least two U.S. patents disclose devices reupon the Inverse Wiedemann Effect, namely, U.S. Patent No. 2,511,178 granted to H. C. Roters on June 12, 1950, and U.S. Patent No. 3,083,353 granted to A. H. Bobeck on Mar. 26, 1963. In the Roters patent, devices are disclosed which rely upon a central core or rod of magnetostrictive material that exhibits a substantially linear, non-hysteretic magnetic induction (B) versus twist ( $\alpha$ ) curve. The reliance on such a material yields a significant limitation in the achievable rate of change of the axial magnetic field produced by twisting magnetostrictive element, whereby to limit the practical voltage output of such devices. The devices described by Bobeck in his aforementioned patent do not vary the amount of twist on the magnetostrictive element, but rely on the interrelationship of a fixedly twisted magnetostrictive element and magnetic fields induced by current flowing through that element and by current flowing through conductive coils surrounding discrete portions of the element.

SUMMARY OF THE INVENTION

The devices of the present invention have a variety of applications. However, irrespective of the application employed, the device must comprise a circularly magnetized rod or magnetostrictive material which exhibits remanence and hysteresis when one plots a curve for the material showing axially magnetic induction ($B_{ax}$) versus angular twist ( $\alpha$ ) of the magnetostrictive rod. If the device is to be employed as a voltage generator, a conductive coil is wound about the circularly magnetized rod and the terminals of the coil may be connected to any suitable load, such as, for example, a battery charger, a spark generator or the like. One of the ends of the rods is held fixed relative to the twistable other end of the rod, which when twisted will cause a change in axial flux within the rod, which change will induce a voltage across the terminals of the surrounding conductive coil.

Other applications for the device above described are in the field of detecting and recording the occurrence of an event. Thus, for example, if the device is to be employed to determine whether or not something has been moved, such as, for example, whether a window or a door has been opened, one end of the rod is fixed and the other end is mechanically connected to the article to be detected so that the other end will be twisted upon movement of said article. When the article is moved, the rod will be twisted to thereby exhibit magnetic induction. When the twist is removed, the axially magnetic induction in the rod will not disappear due to the fact that the device is hysteretic. At some time subsequent to the event of movement, the device can be placed in a suitable detector to determine the presence of axial flux. The detector could be a Hall Effect sensor, or it may be a coil into which the device may be inserted or withdrawn to induce a voltage. Still another means for detecting the fact that the rod had been twisted would be to dispose the twisted rod in a coil and then pass a current through the rod to change the remanent field therein from axial to circular. The change is abrupt and the abrupt change will induce a significant voltage in a surrounding coil to give a voltage indication that the device had in fact been twisted. If it had not been twisted, there would be no output. The advantage of this third means of detection is that it resets the device for subsequent detections by virtue of its removing all axial fields from the device and restoring the magnetization to circular. Still another application of such a electromechanical device would be in a device for generating a voltage once and only once upon a particular sequence of events occurring. In the absence of the sequence, no voltage will be produced. Such a device would include a rod of the type described which upon its becoming circularly magnetized is armed to produce a signal upon the twisting of the rod. When the device is twisted, no further output can be obtained from it because the device exhibits rectangular hysteresis. Thus, the only way to obtain any additional output from the device is to recircularly magnetize it by passing a direct current through the rod at above a given minimum value.

BRIEF DESCRIPTION OF THE DRAWINGS

In the drawings:

FIG. 7 is a view similar to FIG. 1, but showing the electromechanical element of the present invention in a device for detecting maximum twist of the rod-like device from the movement of a monitored object or from shock or the like.

DETAILED DESCRIPTION OF PREFERRED EMBODIMENTS

Figure 1:
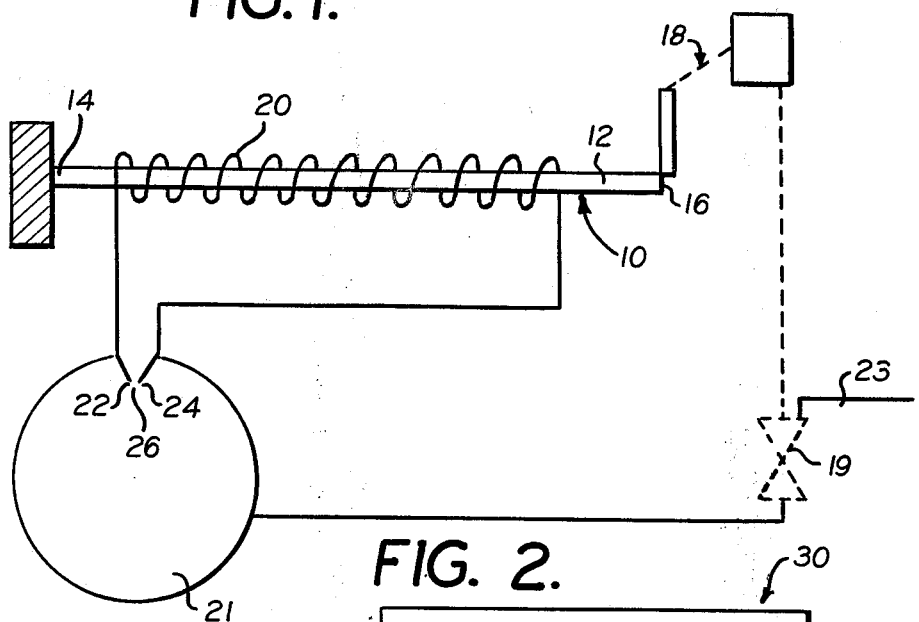
FIG. 1 is a view partly diagrammatic and partly in elevation showing an electromechanical element embodying the present invention incorporated in a spark producing device for a gas burner.

Referring now to the drawings in detail and particularly to FIG. 1 thereof, an electromechanical element 10 of the present invention is shown incorporated in a voltage producing mechanism, especially for use as a spark producing device for a gas burner. The element is shown in the form of a longitudinally extending rod 12 that is fixed at one end 14 and that is twistable at the other end 16 by the application of a torque thereto from a suitable mechanical force producing mechanism shown diagrammatically and referred to by the reference character 18. The twisting mechanism may be, for example, the control knob for the shut off valve 19 of a gas burner 21 fed by a gas line 23. The rod 12 is made of magnetically remanent magnetostrictive material that has been circularly magnetized. The material from which the rod 12 is made exhibits a hysteresis when one plots axially magnetic induction ($B_{ax}$) versus the angle of twist ( $\alpha$ ) of the rod.

Figure 5:
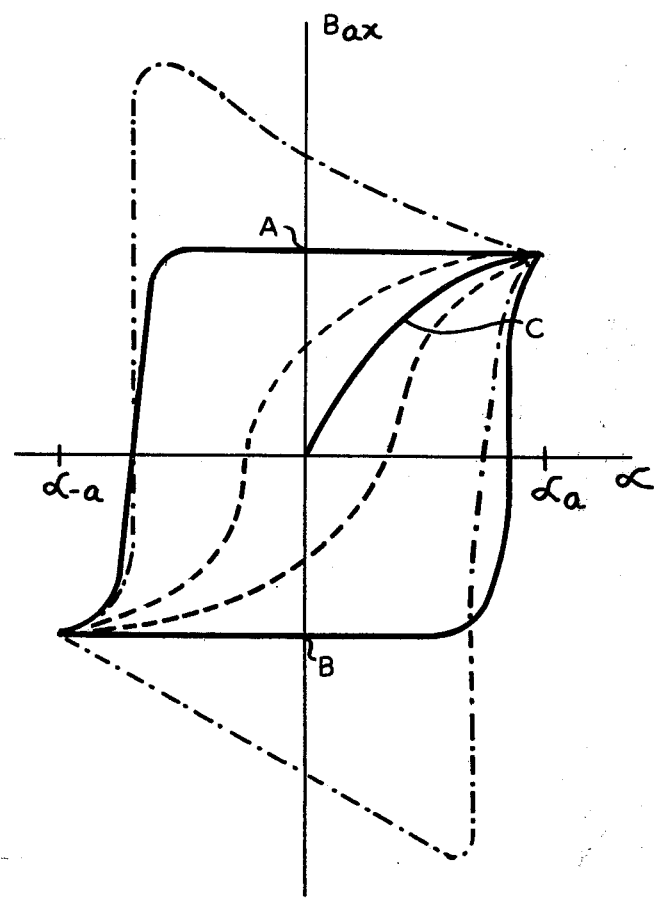
FIG. 5 are graphs of various hysteresis loops showing axial magnetization ($B_{ax}$) as a function of angular twist ( $\alpha$ )

Examples of $B_{ax}$ vs. $\alpha$ curves for materials which would be satisfactory for use as the rod 12 are shown in FIG. 5, wherein three hysteresis loops are shown, one in dashed lines, one in solid lines, one in dashed-dot lines. Any of these three would be satisfactory for use for the material from which rod 12 is made although it would be preferred that the hysteresis loop exhibit approximately a rectangular pattern or more so. That is to say, it would be preferred that the material exhibit the solid line hysteresis loop of FIG. 5 or the dash-dot hysteresis loop of FIG. 5 rather than the dashed line hysteresis loop of FIG. 5 which exhibits a more or less minimum desirable form of hysteresis for embodiment in the present invention.

A number of different materials may be employed which will exhibit the type of hysteresis above referred to and diagrammatically illustrated in FIG. 5. Thus, all steels known as tempered martensites, that is, steels having a martensitic crystalographic structure with the presence of carbides will exhibit the desirable form of hysteresis loops shown in FIG. 5. Specifically, carbon steels such as AISI 1040 and 1065 steels may be employed, low alloy steel, AISI 6150 steel, is suitable, high chrome steels such as AWS 502 and 505 and AISI 410, 416, 420 and 440C are all satisfactory.

Surrounding the rod 12 is a conductive coil which may be made of any suitable conductive material, such as a fine copper wire or the like, preferably insulated as by lacquer. The conductive coil is generally referred to by the reference numeral 20 and as shown has a pair of spaced apart terminals 22 and 24, the space between them here providing for a spark gap 26. When it is desired to cause a spark to appear across the gap 26, the mechanical twisting mechanism 18 is actuated to twist the rod end 16 and, hence, the rod 12, the other end 14 being held against twisting. With reference to FIG. 5, assuming the hysteresis characteristic is the solid line substantially rectangular curve, and further assuming the rod 12 has previously been twisted, it will be found that the rod will be in one of its two $\alpha = 0$ positions, that is, either position A or position B in FIG. 5. Through a suitable indicating or sequence mechanism not forming part of the present invention, it could be indicated which position the rod is in. Assuming the rod to be in the A position as shown in FIG. 5, then it must be twisted in a negative direction to bring it into the third quadrant of its hysteresis loop which will cause the axial magnetic induction to change rapidly from the positive value of the second quadrant to the negative value of the third quadrant along substantially a vertical line. This will cause a very high $d\phi/dt$ in an axial direction which will couple with the turns of the coil 20 to induce a large voltage across the terminals 22 and 24, which voltage will exceed the breakdown voltage between the two terminals and cause a spark to jump therebetween. If, for example, the device 10 is close to gas burner 21, assuming the gas has been turned on, the spark would be sufficient to ignite it. This would obviate the need for a pilot light and thereby save gas. It would also be significantly safer than a pilot light which often blows out in actual use. When the twist is removed, the device will return to the $\alpha = 0$ position, but this time it will be in position B so that the next operation of the device will require a twisting in the opposite direction from the preceding twisting to bring it from the point B through the fourth quadrant of the hysteresis loop and back to point A.

As an alternative to the sequential one-short operation above described, the mechanical mechanism may be of such a nature as to "twang" the end 16 with a suitable inertia producing means such as a ball or the like at the end 16 to set it into oscillation upon being twanged. This oscillation will clearly progress the rod 12 through a number of cycles of hysteresis and cause a spark to appear in rapid succession across the gap 26 a number of times, whereby to insure the ignition of the gas, assuming the device to be coupled with gas burner 21. As shown, mechanical mechanism 18 is a portion of the operating mechanism that turns the gas for burner 21 on, thereby to simultaneously turn on the gas and cause a spark to appear across the gap 26 for igniting the gas as it begins to flow through the burner.

The mechanism 10 may be employed for numerous applications other than that of a spark generator. Thus, for example, this mechanism may also be employed in marine buoys to generate electric energy for charging a battery that operates a lamp or a radio transmitter or the like, thereby to keep the battery fully charged at all times. In such an application, the mechanical mechanism 18 would preferably be of an inertial type that would cause a twisting of the rod in response to the pitching of the buoy as it rides on the waves. In lieu of using the output of the generator shown in FIG. 1 to charge a battery, it could be employed directly with a suitable illumination device such as a neon tube or the like to cause the tube to flash on and off as the waves actuate the device through twisting, thereby obviating the need for a battery or a battery charging circuit.

Figure 2:
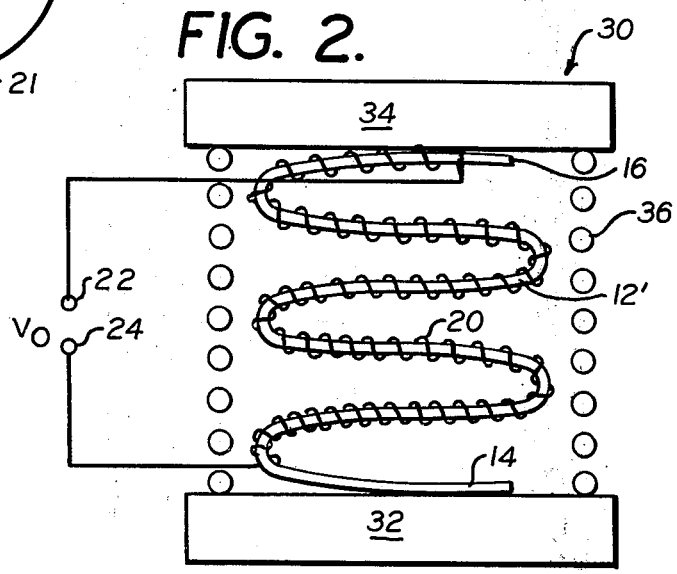
FIG. 2 is a view partly in section and partly in elevation showing a signal generating push button embodying the element of the present invention.

Referring now to FIG. 2, a push button suitable for generating a voltage $V_o$ at its output terminals 22 and 24 is shown. The button is generally designated by the reference character 30 and may be incorporated in any device requiring an electrical output in response to the pressing of a button. Thus, for example, electric typewriters, electric and electronic calculators and the like would all be suitable end uses for buttons of the type designated by the reference character 30. The push button 30 is comprised of a longitudinally extending rod 12' here shown to have been wound into the form of a helical coil for convenience of operation and for certain advantages which will be noted hereinafter. However, with obvious modification, the device would work with an unwound elongated rod 12' if desired. The rod 12' is permanently circularly magnetized, preferably in the manner described in my co-pending application of even date entitled METHOD FOR CIRCULARLY MAGNETIZING A HELICAL ROD, Ser. No. 488,220, which has already been incorporated herein by reference. Rod 12' is made of magnetostrictive material that exhibits hysteresis in its axial magnetic induction versus twist strain curve. Thus, the rod 12' may be made of any of the materials heretofore discussed with respect to rod 12 of FIG. 1 or any materials exhibiting the characteristics above set forth. Wound about the rod 12' is a conductive coil 20 which may be in all respects similar to the conductive coil 20 of FIG. 1. As noted, the coil 20 has output terminals 22 and 24. The coiled rod 12' is fixed at its lower end 14 to a suitable support 32 and is fixed at its upper end 16 to a suitable planar member 34 generally configured as the head of a push button. Extending between the members 32 and 34 is a compression spring 36 which biases the member 34 away from the base 32 and in doing so stresses the rod 12' into the first quadrant as seen in FIG. 5. It will be recognized that the compression or extension of a coiled rod causes the individual increments of said rod to be twisted and, hence, the compressing or extending of the coiled rod 12' yields precisely the same effect as the twisting of the rod 12 of FIG. 1.

Whenever the button 30 is depressed, which depression will compress the coiled rod 12' against the bias of the compression spring 36, irrespective of which of the three hysteresis loops the material of the rod 12' operates along, there will be a twisting of the rod 12' from position $\alpha_a$ which it is in due to the spring 36 to $\alpha_{-a}$ to thus operate to its opposite point in the third quadrant and thus induce a large change in axial magnetic induction, which change will occur extremely rapidly in materials exhibiting a somewhat rectangular hysteresis characteristic, such as exemplified by the solid line hysteresis curve in FIG. 5. However, even if the dashed line hysteresis curve were followed, there will be a significant $d\phi/dt$ encountered by the conductive coil 20, whereby to produce a significant voltage $V_o$ across the terminals 22 and 24 of the coil 20. This voltage may be employed to cause the operation of a key striker of an electric typewriter or the illumination of a light emitting diode in a minature calculator or any of a large number of other functions which will be obvious to those skilled in the art. When the finger is removed from the key face 34, the spring 36 will be effective to restore the coiled rod 12' to its initial condition of twist, namely, $\alpha_a$ in the first quadrant, whereby to condition the push button 30 for its next operation.

In the embodiment of FIG. 2, the circular magnetization of the coiled rod 12' is present by virtue of magnetic remanence, the rod having previously been magnetized by the passage of an electric current therethrough. The order of magnitude of the current employed to permanently circularly magnetize the rod 12' is dependent upon the operating parameters desired and may be of the order of 1 to 10 amperes or the like, although under certain circumstances, it might be of the order of magnitude of hundreds of amperes. The amount of current employed for achieving circular magnetization is dependent upon the coercive force of the material from which the rod 12' is made.

Figure 3:
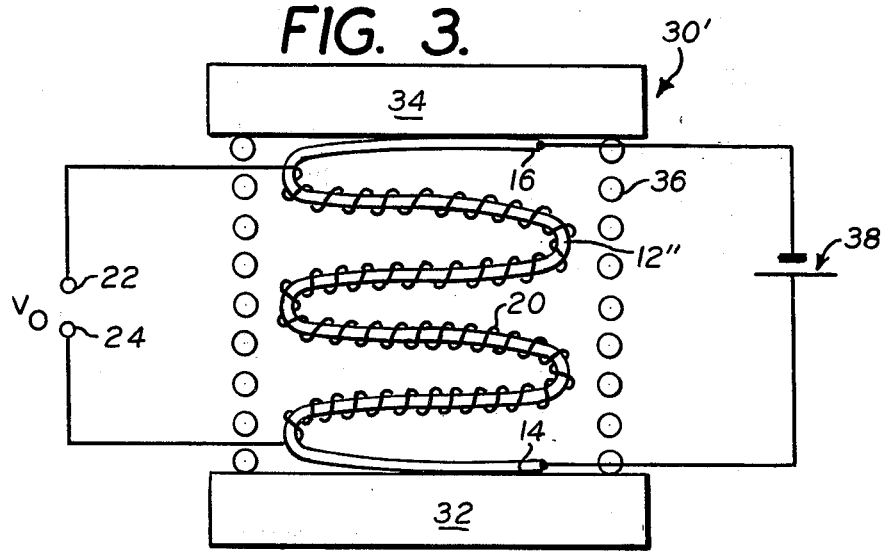
FIG. 3 is a view similar to FIG. 2 showing a modification thereof.

Referring now to FIG. 3, a modified form of push button 30' is shown, which is in all respects identical to the push button 30 of FIG. 2 save for the fact that the circular magnetization of the rod 12'' is not obtained by virtue of permanent circular magnetization, but instead by virtue of the continuous passage of a direct current therethrough. While it would appear at first blush to be a disadvantage to employ current flow as a means of obtaining circular magnetization, as shown in the FIG. 3 embodiment, by employing this approach for securing circular magnetization of the rod 12'', the material requirements for the rod 12'' are changed significantly and somewhat advantageously. Thus, for example, the material from which the rod 12' is preferably made is a relatively hard material exhibiting a high degree of magnetic remanence. Magnetic remanence is not at all important to the embodiment of FIG. 3 as this phenomenon is not relied on in connection with the device 30'. Thus, softer materials such as ingot iron and nickel steel alloys, may be employed in the rod 12'' in the FIG. 3 embodiment, whereas they would not be particularly desirable for incorporation in the FIG. 2 embodiment. Thus, for example, the permalloy alloys may be employed in the FIG. 3 embodiment and would require very low currents from the DC source here shown as battery 38, the currents being of the order of magnitude of less than 1 ampere. Again, as was true with FIGS. 1 and 2, by employing materials exhibiting a large hysteresis, there will necessarily be a rapid rate of change of axial flux when the rod 12'' is twisted from the $\alpha_a$ to the $\alpha_{-a}$ positions in the graphs of FIG. 5, whereby to induce a significant and useful voltage $V_o$ across the output terminals 22 and 24. The applications for this form of push button 30' would essentially be the same as for the push button 30 heretofore described.

Figure 4:
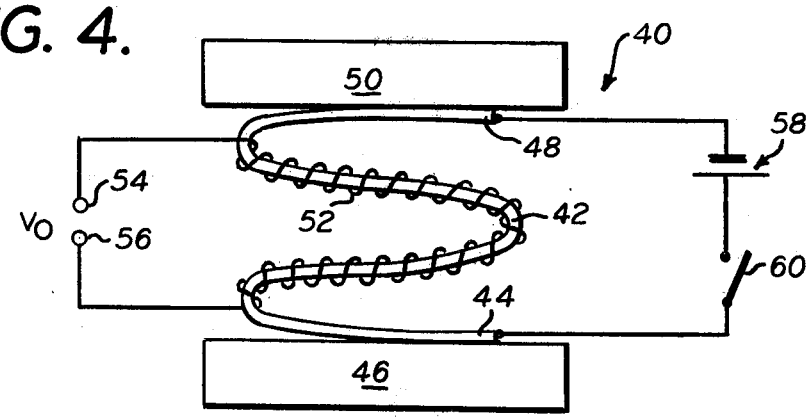
FIG. 4 is a view similar to FIG. 2, but showing a signal generating push button that must be armed prior to operation and is capable of only a single voltage output subsequent to arming without another arming of the device.

Referring now to FIG. 4, still another form of push button is shown. This push button is generally designated by the reference character 40 and is comprised of a rod 42 that is made of a circularly magnetized magnetostrictive material exhibiting a significant hysteresis. For convenience of operation, the rod 42 is preferably wound into a helix, although it may be employed in a straight configuration similar to that shown in FIG. 1. In the helical form shown in FIG. 4, the bottom 44 of the rod 42 is secured to a suitable supporting base 46 and the top 48 of the rod 42 is secured to the movable face 50 of the push button 40. Unlike push buttons of FIGS. 2 and 3, there is no restoring spring 36. There is, however, a conductive coil 52 wound around the coil rod 42, which conductive coil 52 is similar in all respects to coils 20 of the FIGS. 2 and 3 embodiments and is provided with output terminals 54 and 56.

As previously noted, the coiled rod 42 is made of a permanently circularly magnetized material similar to the materials suitable for the rod 12' of FIG. 2. The rod 42 is untwisted at the beginning of its use. That is to say, there is no residual twist and there is no axial magnetic induction present. Thus, the material of rod 42 is at the origin of the $B_{ax}$ vs. $\alpha$ curves of FIG. 5. When the push button face 50 is depressed by the operation of a finger or the like to compress the coil in which rod 42 is shaped, the various increments of the rod 42 will experience a twisting, whereby to operate the rod along the portion C of the $B_{ax}$ vs. $\alpha$ curves of FIG. 5 into the first quadrant. This will cause the appearance of axial magnetic induction in rod 42 which will induce a voltage across the output terminals 54 and 56 of the coiled conductor 52. Assuming that the hysteresis loop of the material of rod 42 is essentially rectangular, that is, the solid line hysteresis loop of FIG. 5, when the operator of the push button 40 releases his finger to thereby permit the rod 42 to restore itself by its own resiliency to the $\alpha = 0$ position, this will have no effect on the coiled conductor 52 as there will be no change in axial flux in coiled rod 42, the axial flux being the same in the first quadrant as it is at the point A where the rod 42 will come to rest. Thereafter, all subsequent operations of the button 40 without recircularly magnetizing the device will yield a zero output. That is, rod 42 will travel back and forth between the A position and the first quadrant position and, because the curve is flat in this region, never experience a significant change in axial magnetization. Thus, the device will yield only one pulse. The advantage of this arrangement is that there are a number of applications where one wishes to require the arming of a switch or actuating button prior to each operation for reasons of safety. The push button 40 of FIG. 4 yields precisely that form of operation. Thus, it will be noted that secured to the ends 44 and 48 of the coil rod 42 are the terminals of a suitable DC source, here shown as a battery 58, controlled by a suitable on-off switch 60. Once the button 40 has been operated, it cannot be employed a second time until the switch 60 is closed to cause a current to flow through the rod 42 to recircularly magnetize the rod 42. Once the pulse of current has passed through the rod, then the push button 40 may be employed again in precisely the same manner as heretofore described.

Examples of suitable applications for the push button 40 are the control of the energization of a photoflash bulb for a camera, wherein the film must be advanced a frame prior to the reoperation of the photoflash. Each time the film is advanced, the switch 60 will be closed to recircularly magnetize the rod 42 and then when the shutter is operated after the film is advanced, rod 42 will be twisted (i.e., the coiled rod compressed) to rapidly change axial flux and thus cause a pulse to appear across the output terminals 54 and 56 to energize the bulb. Another application for device 40 would be as a switch that operates in response to the travel of an actuating mechanism in one direction but not in the other direction. Thus, assuming a device is moving longitudinally back and forth, as it moves forth, it will first encounter the switch 60 to circularly magnetize the rod 42 and it will then encounter the push button face 50 to compress the push button and, hence, twist the rod 42, whereby to put out a signal. When it moves back, it will first hit against the push button 50, but this will have no effect since the device 42 has axial magnetic induction and is operating along the horizontal portion of the hysteresis loop. However, as the device continues back, it will disengage from the member 50 and will engage the actuating mechanism for the switch 60 to recircularly magnetize the device. Thus, it will only operate in one direction; not in the other. In this connection, it will be recognized that a device similar to the helically wound rod 42 and the conductive coil 52 can be substituted for the battery 58 and the switch 60. That is to say, when the second device puts out a voltage $V_o$, that voltage would be applied to the terminals of the rod 42 to circularly magnetize it. When the device 42 is compressed to put out a voltage $V_o$, that voltage would be used to trigger some exterior mechanism and at the same time to recircularly magnetize the second coiled rod.

Figure 6:
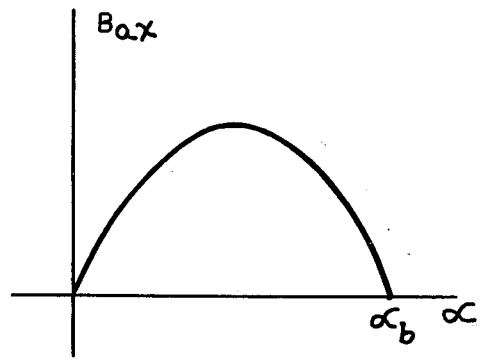
FIG. 6 is a graph plotting axial magnetic induction ($B_{ax}$) against angle of twist ( $\alpha$ )

Referring now to FIG. 6, a different characteristic curve of $B_{ax}$ vs. $\alpha$ is shown for certain materials, which characteristic surve demonstrates that upon the commencement of twisting in a positive direction, axial magnetic induction will appear, but as the twist continues up to a predetermined value $\alpha_{-b}$ in FIG. 6, axial magnetic induction will fall to a zero value. Thereafter, if the device is released and, henced, untwisted, it will return along the axis of the curve and, hence, no magnetic induction will appear. Thus, upon the twisting of a device such as the rod 42 in FIG. 4, which rod shows the characteristic curve of FIG. 6 rather than of FIG. 5, a signal will be produced but upon the return, there will be no second pulse. Thereafter, the device will operate back and forth along the abscissa and give no further output unless it is recircularly magnetized by closing the switch 60 to connect the battery 58 to the materials exhibiting the characteristics such as that shown in FIG. 6 are materials, such as annealed nickel or annealed iron.

Figure 8:
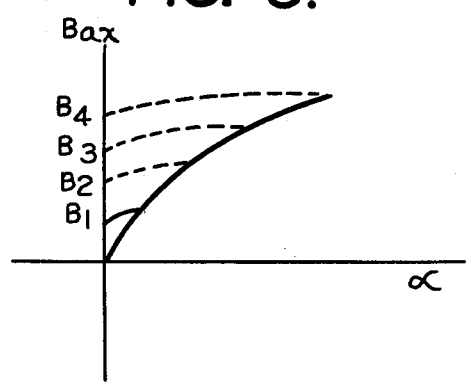
FIG. 8 is a graph plotting axial magnetic induction ($B_{ax}$) versus angle twist ( $\alpha$ ) for the device of FIG. 7.
Figure 7:
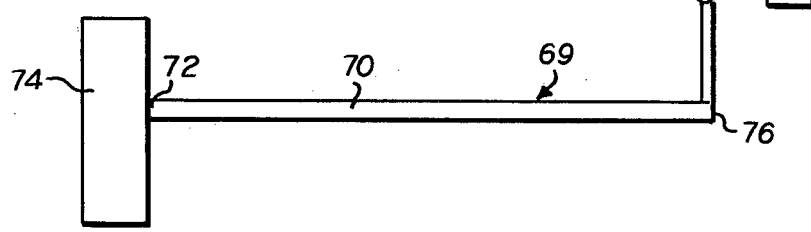

Referring now to FIGS. 7 and 8, devices of the present invention may be employed for detecting a particular event and for storing information concerning that event, especially where the event is translatable into a mechanical movement. Thus, for example, the device of the present invention may be employed to detect that a window or a door has been opened or that a particular package has been subjected to a predetermined amount of shock. Thus, for example, with reference to FIGS. 7 and 8, a rod 70 made of circularly magnetized magnetostrictive material has one end 72 fixed to a suitable support 74 and the other end 76 connected to a mechanical linkage 78 for twisting the end 76. The mechanical linkage 78 may be connected to a window or to a door for twisting the end 76 in response to movement of the window or the door, or it may be connected to some inertial device, such as a large weight or the like, for imparting a twisting movement to the end 76 when the weight is moved in response to a given shock. In the latter example, the device 69 may be mounted within a package being monitored by the device. Assuming that the material from which the rod 69 is made is hysteretic, such as any of the materials heretofore mentioned with respect to the FIG. 2 embodiment of the invention, if a door or window that is being monitored by the device 69 is opened to thus twist end 76 relative to end 72, an axial magnetic induction will appear in the rod 69, which axial magnetic induction will not entirely disappear when the twist is removed from the rod as the rod has hysteresis. Thus, at any time after the event has taken place, the rod 70 can be examined as by a Hall Effect sensor or as by placing it into the center of a coil which is part of a flux measurement instrument and the existence of axial magnetic induction will establish that the door or window has been opened.

When the device 69 of FIG. 7 is employed as a shock detector, it must be permitted to twist only in the positive direction as viewed in FIG. 8 and it has the special desirable property of recording the maximum shock encountered by it. All lesser shocks are superseded by the single greatest shock encountered. This will be readily understood from a persual of FIG. 8 of the drawings showing a magnetization curve. Clearly, the largest shock encountered by the device 69 will impart the largest twist to the rod 70, which twist will cause the largest axial magnetic induction in the rod. SInce the rod exhibits hysteresis, the rod, upon being untwisted as by the dissipation of the shock force, will return to the $\alpha = 0$ position, which in the case of the largest shock will be at a point of $B_4$. Any shocks of lesser strength than that giving rise to the magnetic induction $B_4$ will simply have no effect upon the magnetic properties of the rod 70. Thus, when the monitored package arrives, the device 69 may be removed and the rod 70 may be examined by a magnetic flux indicator to determine the amount of axial magnetization present. That amount can be translated directly into the amount of shock encountered by the device and, hence, the package.

In the preceding specification, I have referred to rods. As used herein, the term "rod" is intended to include tubes as well as solid rods. Moreover, while the rods are sometimes referred to as longitudinally extending, they may be wound into the form of a helix and will still be considered, for the sake of this specification and the claims annexed hereto, to be longitudinally extending.

It will be understood that the reason for the preference in a number of embodiments for the helically wound rods is that they give rise to a more compact instrument than one that has not been helically wound. In addition, in the helical configuration, the rod can be tailored to yield a particular desired ratio of mass to spring constant and thereby yield particular mechanical properties that will be convenient for use in the particular application. When these advantages are not desired, the straight rod embodiments, as for example shown in FIGS. 1 and 7, are suitable. Moreover, it will be understood that with obvious modification, the helically wound rods of FIGS. 2, 3 and 4 could be straight without departing from the invention.

While I have herein shown and described the preferred forms of the present invention, and have suggested modifications thereof, other changes and modifications may be made therein within the scope of the appended claims without departing from the spirit and scope of this invention.

What is claimed is:

1. An electromechanical element, comprising:
    a circularly magnetized, magnetostrictive rod that exhibits hysteresis in its magnetic induction vs. twist strain curve.

2. The element of claim 1, wherein the hysteresis curve is such that the magnetic induction at zero twist is not less than one-half the induction at maximum twist.

3. The element of claim 1, wherein the hysteresis curve is such that the magnetic induction at zero twist is not less than about the same value of magnetic induction at maximum twist.

4. A voltage producing device, comprising:
    a circularly magnetized, magnetostrictive rod that exhibits hysteresis in its magnetic induction vs. twist strain curve;
    a conductive coil wound on said rod, said coil having a pair of output terminals; and
    means for twisting said rod, whereby to produce a voltage between said output terminals.

5. The voltage producing device of claim 4 in combination with a fluid fuel burner, said output terminals being disposed at said burner for igniting said fluid fuel.

6. The combination of claim 5, further comprising a valve for controlling the supply of fluid fuel to said burner, and means for connecting said twisting means to said valve for opening said valve when said rod is being twisted.

7. The electromechanical element of claim 1, wherein said rod is magnetically remanent and said circular magnetization is due to said magnetic remanence.

8. The electromechanical element of claim 1, further comprising means for causing a DC current to flow through said rod, whereby to produce said circular magnetization.

9. The voltage producing device of claim 4, wherein said rod is wound into a helical coil, and said means for twisting said rod is a means for changing the length of said coil.

10. The voltage producing device of claim 9, wherein said rod is magnetically remanent and said circular magnetization is due to said magnetic remanence.

11. The voltage producing device of claim 9, further comprising means for causing a DC current to flow through said rod, whereby to produce said circular magnetization.

12. The voltage producing device of claim 4, wherein the hysteresis curve is such that the magnetic induction at zero twist is not less than about the same value of magnetic induction at maximum twist, and means for passing a DC current through said rod to recircularly magnetize said rod after twisting.

13. A voltage producing device comprising:
    a circularly magnetized magnetostrictive rod that exhibits a magnetic induction vs. twist strain curve that starts at coordinates zero-zero and then shows magnetic induction as said rod is twisted and shows a drop in said induction to about zero as more twist is put into said rod;
    a conductive coil wound on said rod, said coil having a pair of output terminals; and
    means for twisting said rod.

14. In combination with the electromechanical element of claim 1, means for twisting said element.

* * * * *